(12) United States Patent
Togami

(10) Patent No.: US 7,859,905 B2
(45) Date of Patent: Dec. 28, 2010

(54) SEMICONDUCTOR STORAGE DEVICE AND METHOD OF MANUFACTURING THE SAME

(75) Inventor: Tetsuji Togami, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 148 days.

(21) Appl. No.: 11/498,817

(22) Filed: Aug. 4, 2006

(65) Prior Publication Data
US 2007/0041248 A1    Feb. 22, 2007

(30) Foreign Application Priority Data
Aug. 18, 2005    (JP)    ............................... 2005-237235

(51) Int. Cl.
*G11C 11/34*    (2006.01)
(52) U.S. Cl. .............................. 365/185.2; 365/185.24; 257/392; 257/547
(58) Field of Classification Search .............. 365/185.2, 365/185.24; 438/183; 257/355, 392, 487, 257/547
See application file for complete search history.

(56) References Cited

U.S. PATENT DOCUMENTS

| | | | | |
|---|---|---|---|---|
| 5,241,210 A | * | 8/1993 | Nakagawa et al. .......... | 257/487 |
| 5,644,157 A | * | 7/1997 | Iida et al. ..................... | 257/510 |
| 6,172,405 B1 | * | 1/2001 | Shibata et al. ............... | 257/371 |
| 6,252,269 B1 | * | 6/2001 | Hasegawa et al. ........... | 257/306 |
| 6,333,870 B1 | * | 12/2001 | Kang .......................... | 365/145 |
| 6,593,158 B1 | * | 7/2003 | Takahashi .................... | 438/18 |
| 6,778,426 B2 | * | 8/2004 | Hosotani ..................... | 365/158 |
| 6,835,987 B2 | * | 12/2004 | Yaegashi ..................... | 257/391 |
| 2005/0276112 A1 | * | 12/2005 | Kido et al. ............. | 365/185.21 |
| 2006/0221669 A1 | * | 10/2006 | Hamada ...................... | 365/149 |
| 2008/0079110 A1 | * | 4/2008 | Kikuchi et al. .............. | 257/476 |

FOREIGN PATENT DOCUMENTS

| | | |
|---|---|---|
| JP | 61017297 A | 1/1986 |
| JP | 03242898 A | 10/1991 |
| JP | 2000357751 A | 12/2000 |
| JP | 3578661 B | 7/2004 |

* cited by examiner

*Primary Examiner*—VanThu Nguyen
(74) *Attorney, Agent, or Firm*—Sughrue Mion, PLLC

(57) ABSTRACT

A method of manufacturing a semiconductor storage device according to an embodiment of the present invention includes forming dummy cells $61_1$ to $61_8$ at a position adjacent to a reference cell $41_2$, and implanting an impurity into the dummy cells $61_1$ to $61_8$ using a mask that covers the reference cell $41_2$. Here, the process of implanting the impurity is carried out so that the impurity exudes out of the dummy cells $61_1$ to $61_8$ to the reference cell $41_2$.

3 Claims, 9 Drawing Sheets

SEMICONDUCTOR STORAGE DEVICE AND METHOD OF MANUFACTURING THE SAME

This application is based on Japanese patent application No. 2005-237235, the content of which is incorporated hereinto by reference.

BACKGROUND

1. Technical Field

The present invention relates to a semiconductor storage device and a method of manufacturing the same.

2. Related Art

A sense amp included in a semiconductor storage device is a circuit that quickly detects a minute fluctuation in status of each memory cell (such as fluctuation in current and potential) in a form of a large potential amplitude. Characteristics required from the sense amp include high speed, a wide range of voltage and temperature, and a sufficient margin for process fluctuation and power source noise. Now that the ultra high level of integration progresses, the range of voltage and temperature, as well as the margin for process fluctuation are being forced to be reduced, and hence such characteristics have to be improved.

The semiconductor storage devices so far developed include the one disclosed in Japanese patent publication No. 3578661. The semiconductor storage device according to this document is a non-volatile semiconductor storage device such as a mask ROM, which retains data stored in the memory cell despite turning off. This device includes, as shown in FIG. 4, a memory cell $111_1$, selection cells $112_{11}$, $112_{21}$, a word line 113, column lines $114_1$, $114_2$, a word line drive circuit 115, column selection circuits $116_1$, $116_2$, a read-out driver $119_1$, a buffer $120_1$, a reference unit 122, and a sense amp $123_1$.

The memory cell $111_1$ is constituted of MOS transistors, the gates of which are mutually connected via the word line 113, and are connected to an output terminal of the word line drive circuit 115 via the word line 113.

The selection cell $112_{11}$ is constituted of MOS transistors, the gates of which are mutually connected via the column line $114_1$, and are connected to an output terminal of the column selection circuit $116_1$ via the column line $114_1$. The column selection circuit $116_1$ decodes an address provided from outside at a first stage decoding and applies, when the column line $114_1$ is thereby selected, a high level (hereinafter, H-level) signal to the column line $114_1$. Accordingly, the H-level signal is applied to the gate of the selection cell $112_{11}$, so that the selection cell $112_{11}$ is turned ON thus to form a path for reading out therethrough the data from the memory cell $111_1$.

The selection cell $112_{21}$ is constituted of MOS transistors, the gates of which are mutually connected via the column line $114_2$, and are connected to an output terminal of the column selection circuit $116_2$ via the column line $114_2$. The column selection circuit $116_2$ decodes an address provided from outside at a second stage decoding and applies, when the column line $114_2$ is thereby selected, a H-level signal to the column line $114_2$. Accordingly, the H-level signal is applied to the gate of the selection cell $112_{21}$, so that the selection cell $112_{21}$ is turned ON thus to form a path for reading out therethrough the data from the memory cell $111_1$.

Once a signal instructing to read out the data is received from outside, a low level (hereinafter, L-level) signal indicating start of the data read-out is applied to a sense amp activating signal, which provides the L-level signal to the read-out driver $119_1$, the buffer $120_1$ and the reference unit 122.

The read-out driver $119_1$ includes a drive transistor $131_1$, a path-forming transistor $132_1$, a path-blocking transistor $133_1$, and a NOR gate $134_1$.

The drive transistor $131_1$ is constituted of a MOS transistor, and applies a voltage according to the ON/OFF status of the memory cell $111_1$ to an input terminal of the buffer $120_1$. The path-forming transistor $132_1$ is constituted of a MOS transistor, and is turned ON by a H-level signal provided by the NOR gate $134_1$, so as to form a path for reading out the data therethrough from the memory cell $111_1$. The path-blocking transistor $133_1$ is constituted of a MOS transistor, and is turned ON by a H-signal provided by the sense amp activating signal, so as to block the path for reading out the data therethrough from the memory cell $111_1$. The NOR gate $134_1$ receives the sense amp activating signal at a first input terminal thereof. The NOR gate $134_1$ has a second input terminal connected to the source of the path-forming transistor $132_1$, so as to output a H-level signal to turn ON the path-forming transistor $132_1$, when the signal provided by the sense amp activating signal and the voltage of the source of the path-forming transistor $132_1$ are both at the L-level.

The buffer $120_1$ includes power MOS transistors $135_1$, $136_1$, and a MOS transistor $137_1$ that constitutes a constant current source. The buffer $120_1$ serves to buffer and amplify an input voltage, and to apply an output voltage $V_{D1}$ thereof to a first input terminal of the sense amp $123_1$.

The reference unit 122 includes reference cells $141_1$, $141_2$, selection cells $142_{11}$, $142_{12}$, $142_{21}$, $142_{22}$, a word line drive circuit 143, column selection circuits $144_1$, $144_2$, drive transistors $145_1$, $145_2$, path-forming transistors $146_1$, $146_2$, path-blocking transistors $147_1$, $147_2$, NOR gates $148_1$, $148_2$, power MOS transistors $149_1$, $149_2$, $150_1$, $150_2$, and MOS transistors $151_1$, $151_2$ that constitute a constant current source.

The reference cells $141_1$, $141_2$ are MOS transistors which have the same structure and characteristic with the memory cell $111_1$. The reference cell $141_1$ is set in advance as a depression transistor, namely in an ON state, by phosphor ion implantation. The other reference cell $141_2$ is set in advance as an enhance transistor, namely in an OFF state, without undergoing the phosphor ion implantation.

The selection cells $142_{11}$, $142_{12}$ have the same structure and characteristic with the selection cell $112_{11}$; the selection cells $142_{21}$, $142_{22}$ with the selection cell $112_{21}$; the word line drive circuit 143 with the word line drive circuit 115; the column selection circuit $144_1$ with the column selection circuit $116_1$; the column selection circuit $144_2$ with the column selection circuit $116_2$; the drive transistors $145_1$, $145_2$ with the drive transistor $131_1$; and the path-forming transistors $146_1$, $146_2$ with the path-forming transistors $132_1$, respectively.

Likewise, path-blocking transistor $147_1$, $147_2$ have the same structure and characteristic with the path-blocking transistor $133_1$; the NOR gates $148_1$, $148_2$ with the NOR gate $134_1$; the power MOS transistors $149_1$, $149_2$, $150_1$, $150_2$ with the power MOS transistors $135_1$, $136_1$; and the MOS transistors $151_1$, $151_2$ with the MOS transistor $137_1$, respectively.

A purpose of such configuration is, because the sense amp $123_1$ is constituted of a differential amplifier, to equilibrate as much as possible a load connected to the first input terminal thereof with a load connected to the second input terminal thereof.

The drive transistor $145_1$ applies a voltage $V_{RON}$ according to an ON state of the reference cell $141_1$ to the gate of the power MOS transistor $150_1$. Likewise, the drive transistor $145_2$ applies a voltage $V_{ROFF}$ according to an OFF state of the reference cell $141_2$ to the gate of the power MOS transistor $150_2$.

The power MOS transistors $149_1$, $150_1$, and the MOS transistor $151_1$ constituting the constant current source buffer and amplify the output voltage $V_{RON}$ of the drive transistor $145_1$. On the other hand, the power MOS transistors $149_2$, $150_2$, and the MOS transistor $151_2$ constituting the constant current source buffer and amplify the output voltage $V_{ROFF}$ of the drive transistor $145_2$. That is, the power MOS transistors $149_1$, $149_2$, $150_1$, $150_2$ and the MOS transistors $151_1$, $151_2$ constitute a buffer 152.

Accordingly, when an output current of the buffer of the power MOS transistor $150_1$ is denoted by $I_1$, and an output current of the power MOS transistor $150_2$ by $I_2$, a current $I_R$, which is the average of the current $I_1$ and the current $I_2$ as indicated by the equation (1), runs through the constant current sources, respectively constituted of the MOS transistor $151_1$ and $151_2$.

$$I_R = (I_1 + I_2)/2 \qquad (1)$$

To the second input terminal of the sense amp $123_1$, therefore, a voltage $V_R$, which is the average of the voltage $V_{RON}$ according to the ON state of the reference cell $141_1$ and the voltage $V_{ROFF}$ according to the OFF state of the reference cell $141_2$ as indicated by the equation (2), is applied.

$$V_R = (V_{RON} + V_{ROFF})/2 \qquad (2)$$

As already stated the sense amp $123_1$ is constituted of a differential amplifier, so as to detect and amplify a difference between the voltage supplied by the buffer $120_1$ and the voltage supplied by the reference unit 122, and outputs the data to outside.

SUMMARY OF THE INVENTION

With such configuration, however, reduction in pitch between the respective memory cells because of the progress in the level of integration disables the fabrication of the MOS transistors and memory cells having "the same structure and characteristic". Referring to FIG. 5, a configuration of a memory cell of a mask ROM will be described as an example.

FIG. 5 is a schematic diagram showing a detailed configuration of the word line drive circuit 115, the memory cell $111_1$ and the word line 113 shown in FIG. 4. In FIG. 5, single circles represent ON cells, and double circles represent OFF cells. In this example, the memory cell $111_1$ is an OFF cell.

The ON cells and the OFF cells in the mask ROM are distinguished, as stated above, by whether the cell is subjected to the phosphor ion implantation. A photoresist (PR) with openings at the positions of the ON cells but covering the OFF cells is employed, so that the cells at the openings are subjected to the ion implantation, to thereby turn into depression transistors, namely ON cells. In contrast, the covered cells are not subjected to the ion implantation, thereby turning into enhance transistors, namely OFF cells.

Because of the reduction in pitch between the memory cells due to the progress in level of integration, however, the ion in the ON cells (memory cells $111_2$ to $111_9$) may exude toward the adjacent memory cell $111_1$ which is the OFF cell. This leads to a drop in threshold value of the memory cell $111_1$, which causes a leak current to run between the drain and the source of the cell, thereby provoking an erroneous decision by the sense amp $123_1$. Such phenomenon randomly takes place even under the identical ROM arrangement (layout of the ON cells and the OFF cells). Therefore, despite setting the voltage to be applied to the second input terminal of the sense amp $123_1$ at the median value between the $V_{DON}$ and the $V_{DOFF}$, the erroneous decision may still be committed.

Such aspect will be further described referring to FIG. 6. With the start of the data read-out, the voltage $V_{D1}$ and the voltage $V_R$ respectively applied to the first and the second input terminal of the sense amp $123_1$ increase through a generally similar process, until the selection cells $112_{11}$, $112_{21}$, the selection cells $142_{11}$, $142_{21}$ and the selection cells $142_{12}$, $142_{22}$ are turned ON. Then, until a H-level signal is applied to a location other than the word line 113, the voltage $V_{D1}$ and the voltage $V_R$ increase through a similar process (point A in FIG. 6). After a H-level signal is applied to a location other than the word line 113, the voltage $V_R$ keeps increasing along an unchanged slope because the word line drive circuit 143 is a dummy circuit, thus to be saturated (line B in FIG. 6).

In contrast, the voltage $V_{D1}$ starts to decrease when the memory cell $111_1$ is an ON cell (line C in FIG. 6). When the memory cell is an OFF cell and does not incur cell leak, the voltage $V_{D1}$ keeps increasing further (line D in FIG. 6), however, when the memory cell is an OFF cell and incurs cell leak, the voltage $V_{D1}$ settles close to $V_R$ (line E in FIG. 6). Accordingly, when the memory cell $111_1$ is an OFF cell and incurs cell leak, the level of the $V_{D1}$ and the $V_R$ is reversed, thus provoking an erroneous decision.

According to the present invention, there is provided a method of manufacturing a semiconductor storage device that compares a voltage between memory cells and reference cells to thereby read out data stored in the memory cells, comprising forming a dummy cell at a position adjacent to a reference cell out of the reference cells that is set in an OFF state; and implanting an impurity into the dummy cell using a mask that covers the reference cell set in an OFF state; wherein the impurity is implanted so as to exude out of the dummy cell to the reference cell set in an OFF state.

By the method of manufacturing thus arranged, the impurity is implanted into the dummy cell adjacent to the reference cell so as to exude out of the dummy cell to the reference cell. This provokes leak from the reference cell, under a high temperature. The leak lowers the voltage level of the reference cell, thereby preventing the voltage of the memory cell and that of the reference cell from being reversed, even when the memory cell incurs leak.

According to the present invention, there is provided a semiconductor storage device comprising a reference cell that includes a first region located between two isolation regions and having a first impurity concentration, and a second region located between the first region and at least one of the isolation regions and having a second impurity concentration higher than the first impurity concentration.

In the semiconductor storage device thus constructed, the reference cell includes the first region having a relatively low impurity concentration, and the second region having a relative high impurity concentration. Such structure provokes leak from the reference cell, under a high temperature. Therefore, as stated above, the voltage of the memory cell and that of the reference cell can be prevented from being reversed.

The present invention also provides a semiconductor storage device that reads out information stored in a memory cell through comparison with information of a reference cell serving as a standard, wherein the memory cell has a first off-leak characteristic; and the reference cell has a second off-leak characteristic larger than the first off-leak characteristic.

In the semiconductor storage device thus configured, the reference cell has a larger off-leak characteristic than the memory cell. Such configuration provokes leak from the reference cell, under a high temperature. Therefore, as stated above, the voltage of the memory cell and that of the reference cell can be prevented from being reversed.

Thus, the present invention provides a semiconductor storage device in which a probability of an erroneous decision at the time of read-out is lowered, and a method of manufacturing such semiconductor storage device.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
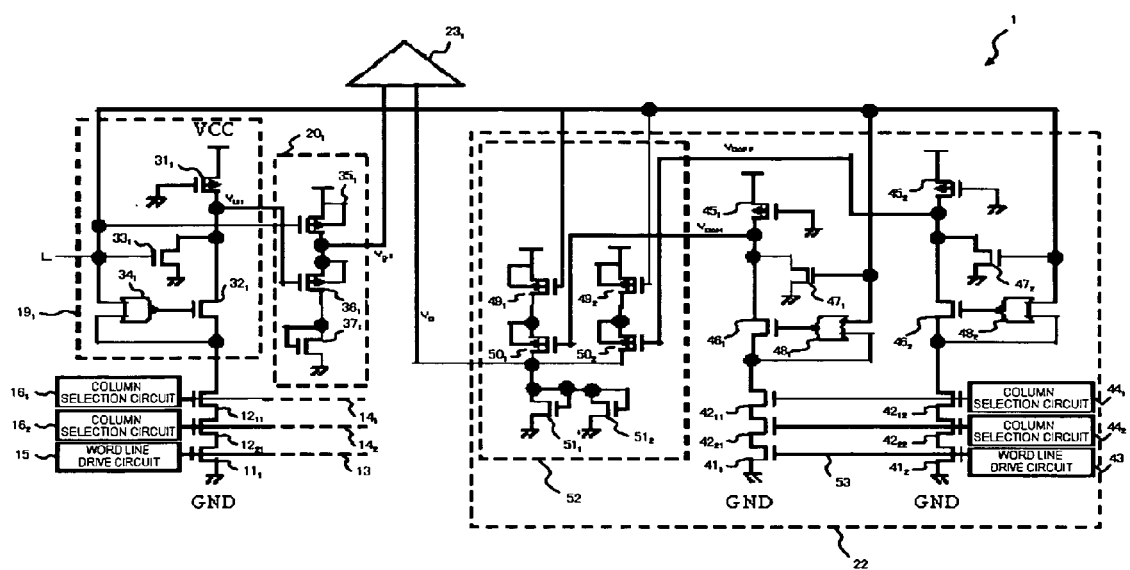
FIG. 1 is a circuit diagram of a semiconductor storage device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor storage device and a method of manufacturing the same according to the present invention will be described in details, referring to the accompanying drawings. In the drawings, same constituents are given the identical numerals, and duplicating description will not be repeated where appropriate.

FIG. 1 is a circuit diagram of a semiconductor storage device according to an embodiment of the present invention. The semiconductor storage device 1 is a non-volatile semiconductor storage device, and includes a memory cell $11_1$, selection cells $12_{11}$, $12_{21}$, a word line 13, column lines $14_1$, $14_2$, a word line drive circuit 15, column selection circuits $16_1$, $16_2$, a read-out driver $19_1$, a buffer $20_1$, a reference unit 22, and a sense amp $23_1$.

The memory cell $11_1$ is constituted of MOS transistors, the gates of which are mutually connected via the word line 13, and are connected to an output terminal of the word line drive circuit 15 via the word line 13.

The selection cell $12_{11}$ is constituted of MOS transistors, the gates of which are mutually connected via the column line $14_1$, and are connected to an output terminal of the column selection circuit $16_1$ via the column line $14_1$. The column selection circuit $16_1$ decodes an address provided from outside at the first stage decoding and applies, when the column line $14_1$ is thereby selected, a H-level signal to the column line $14_1$. Accordingly, the H-level signal is applied to the gate of the selection cell $12_{11}$, so that the selection cell $12_{11}$ is turned ON thus to form a path for reading out therethrough the data from the memory cell $11_1$.

The selection cell $12_{21}$ is constituted of MOS transistors, the gates of which are mutually connected via the column line $14_2$, and are connected to an output terminal of the column selection circuit $16_2$ via the column line $14_2$. The column selection circuit $16_2$ decodes an address provided from outside at the second stage decoding and applies, when the column line $14_2$ is thereby selected, a H-level signal to the column line $14_2$. Accordingly, the H-level signal is applied to the gate of the selection cell $12_{21}$, so that the selection cell $12_{21}$ is turned ON thus to form a path for reading out therethrough the data from the memory cell $11_1$.

Once a signal instructing to read out the data is received from outside, a L-level signal indicating start of the data read-out is applied to a sense amp activating signal, which provides the L-level signal to the read-out driver $19_1$, the buffer $20_1$ and the reference unit 22.

The read-out driver $19_1$ includes a drive transistor $31_1$, a path-forming transistor $32_1$, a path-blocking transistor $33_1$, and a NOR gate $34_1$.

The drive transistor $31_1$ is constituted of a MOS transistor, and applies a voltage according to the ON/OFF status of the memory cell $11_1$ to an input terminal of the buffer $20_1$. The path-forming transistor $32_1$ is constituted of a MOS transistor, and is turned ON by a H-level signal provided by the NOR gate $34_1$, so as to form a path for reading out the data therethrough from the memory cell $11_1$. The path-blocking transistor $33_1$ is constituted of a MOS transistor, and is turned ON by a H-signal provided by the sense amp activating signal, so as to block the path for reading out the data therethrough from the memory cell $11_1$. The NOR gate $34_1$ receives the sense amp activating signal at a first input terminal thereof. The NOR gate $34_1$ has a second input terminal connected to the source of the path-forming transistor $32_1$, so as to output a H-level signal to turn ON the path-forming transistor $32_1$, when the signal provided by the sense amp activating signal and the voltage of the source of the path-forming transistor $32_1$ are both at the L-level.

The buffer $20_1$ includes power MOS transistors $35_1$, $36_1$, and a MOS transistor $37_1$ that constitutes a constant current source. The buffer $20_1$ serves to buffer and amplify an input voltage, and to apply an output voltage $V_{D1}$ thereof to a first input terminal of the sense amp $23_1$.

The reference unit 22 includes reference cells $41_1$, $41_2$, selection cells $42_{11}$, $42_{12}$, $42_{21}$, $42_{22}$, a word line drive circuit 43, column selection circuits $44_1$, $44_2$, drive transistors $45_1$, $45_2$, path-forming transistors $46_1$, $46_2$, path-blocking transistors $47_1$, $47_2$, NOR gates $48_1$, $48_2$, power MOS transistors $49_1$, $49_2$, $50_1$, $50_2$, and MOS transistors $51_1$, $51_2$ that constitute a constant current source.

The reference cells $41_1$, $41_2$ are MOS transistors which have the same structure and characteristic with the memory cell $11_1$. The reference cell $41_1$ is set in advance as a depression transistor, namely in an ON state, by phosphor ion implantation. The other reference cell $41_2$ is set in advance as an enhance transistor, namely in an OFF state, without undergoing the phosphor ion implantation.

The selection cells $42_{11}$, $42_{12}$ have the same structure and characteristic with the selection cell $12_{11}$; the selection cells $42_{21}$, $42_{22}$ with the selection cell $12_{21}$; the word line drive circuit 43 with the word line drive circuit 15; the column selection circuit $44_1$ with the column selection circuit $16_1$; the column selection circuit $44_2$ with the column selection circuit $16_2$; the drive transistors $45_1$, $45_2$ with the drive transistor $31_1$;

and the path-forming transistors $46_1$, $46_2$ with the path-forming transistors $32_1$, respectively.

Likewise, path-blocking transistors $47_1$, $47_2$ have the same structure and characteristic with the path-blocking transistor $33_1$; the NOR gates $48_1$, $48_2$ with the NOR gate $34_1$; the power MOS transistors $49_1$, $49_2$, $50_1$, $50_2$ with the power MOS transistors $35_1$, $36_1$; and the MOS transistors $51_1$, $51_2$ with the MOS transistor $37_1$, respectively.

A purpose of such configuration is, because the sense amp $23_1$ is constituted of a differential amplifier, to equilibrate as much as possible a load connected to the first input terminal thereof with a load connected to the second input terminal thereof.

The drive transistor $45_1$ applies a voltage $V_{RON}$ according to an ON state of the reference cell $41_1$ to the gate of the power MOS transistor $50_1$. Likewise, the drive transistor $45_2$ applies a voltage $V_{ROFF}$ according to an OFF state of the reference cell $41_2$ to the gate of the power MOS transistor $50_2$.

The power MOS transistors $49_1$, $50_1$, and the MOS transistor $51$ constituting the constant current source buffer and amplify the output voltage $V_{RON}$ of the drive transistor $45_1$. On the other hand, the power MOS transistors $49_2$, $50_2$, and the MOS transistor $51_2$ constituting the constant current source buffer and amplify the output voltage $V_{ROFF}$ of the drive transistor $45_2$. That is, the power MOS transistors $49_1$, $49_2$, $50_1$, $50_2$ and the MOS transistors $51_1$, $51_2$ constitute a buffer $52$.

Accordingly, when an output current of the buffer of the power MOS transistor $50_1$ is denoted by $I_1$, and an output current of the power MOS transistor $50_2$ by $I_2$, a current $I_R$, which is the average of the current $I_1$ and the current $I_2$ (Ref. the foregoing equation (1)), runs through the constant current sources, respectively constituted of the MOS transistor $51_1$ and $51_2$.

To the second input terminal of the sense amp $23_1$, therefore, a voltage $V_R$, which is the average of the voltage $V_{RON}$ according to the ON state of the reference cell $41_1$ and the voltage $V_{ROFF}$ according to the OFF state of the reference cell $41_2$ (Ref. the foregoing equation (2)), is applied.

As already stated the sense amp $23_1$ is constituted of a differential amplifier, so as to detect and amplify a difference between the voltage supplied by the buffer $20_1$ and the voltage supplied by the reference unit $22$, and outputs the data to outside.

Figure 2:
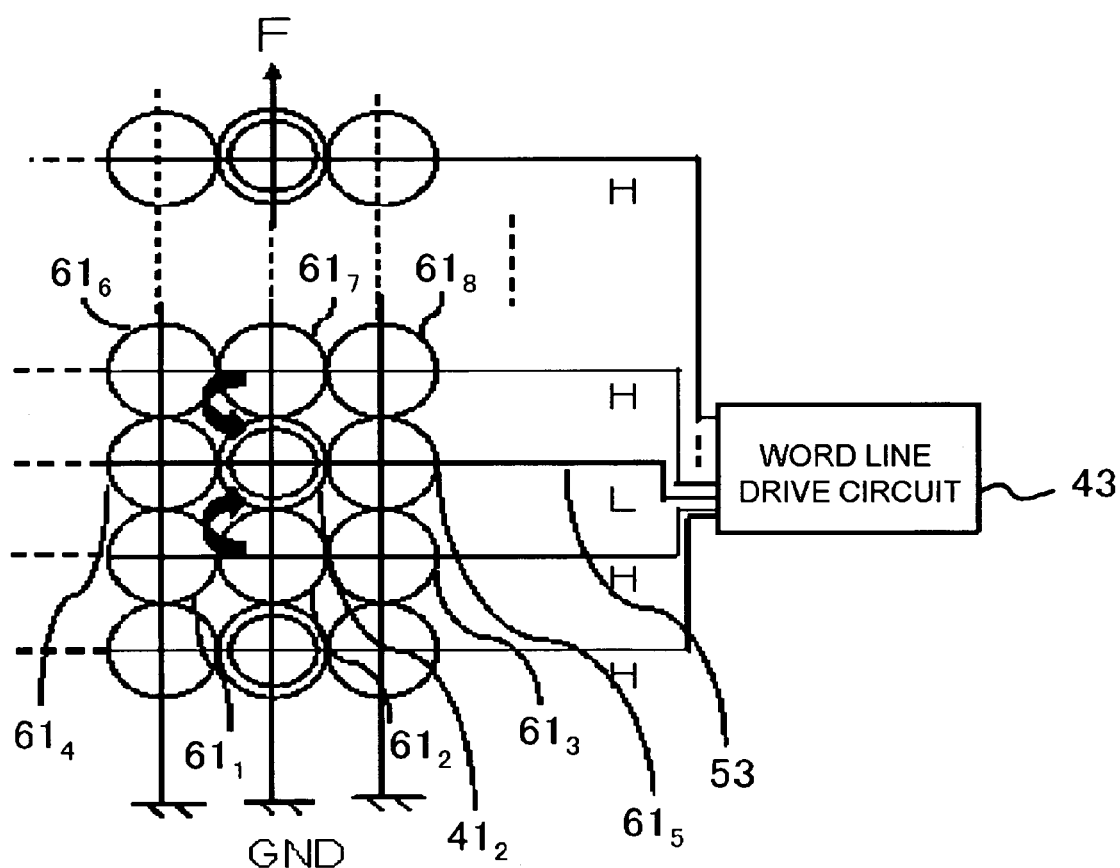
FIG. 2 is a schematic diagram showing a detailed configuration of a word line drive circuit, reference cells and a word line in the semiconductor storage device of FIG. 1.

FIG. 2 is a schematic diagram showing a detailed configuration of the word line drive circuit $43$, the reference cell $41_2$ and the word line $53$ in the semiconductor storage device $1$. In FIG. 2, single circles represent ON cells, and double circles represent OFF cells. In this embodiment, the reference cell $41_2$ is an OFF cell.

Around the reference cell $41_2$, dummy cells $61_1$ to $61_8$ are disposed. The dummy cells $61_1$ to $61_8$ are located adjacent to the reference cell $41_2$. The output terminal of the word line drive circuit $43$ is connected to the gates of the respective cells via the word line $53$. The drains of the cells are connected to the source of cells at a lower stage, and the sources of the cells at the lowermost stage are grounded. The drains of the cells at the uppermost stage are connected to the source of the selection cell $42_{22}$ (FIG. 1).

Hereunder, a method of manufacturing the semiconductor storage device $1$ will be described, as an embodiment of a method of manufacturing a semiconductor storage device according to the present invention. The method of manufacturing includes forming the dummy cells $61_1$ to $61_8$ at a position adjacent to the reference cell $41_2$, and implanting an impurity into the dummy cells $61_1$ to $61_{18}$ using a mask that covers the reference cell $41_2$. Here, the process of implanting the impurity is carried out so that the impurity exudes out of the dummy cells $61_1$ to $61_8$ to the reference cell $41_2$. An example of the impurity is phosphor ion.

Figure 7:
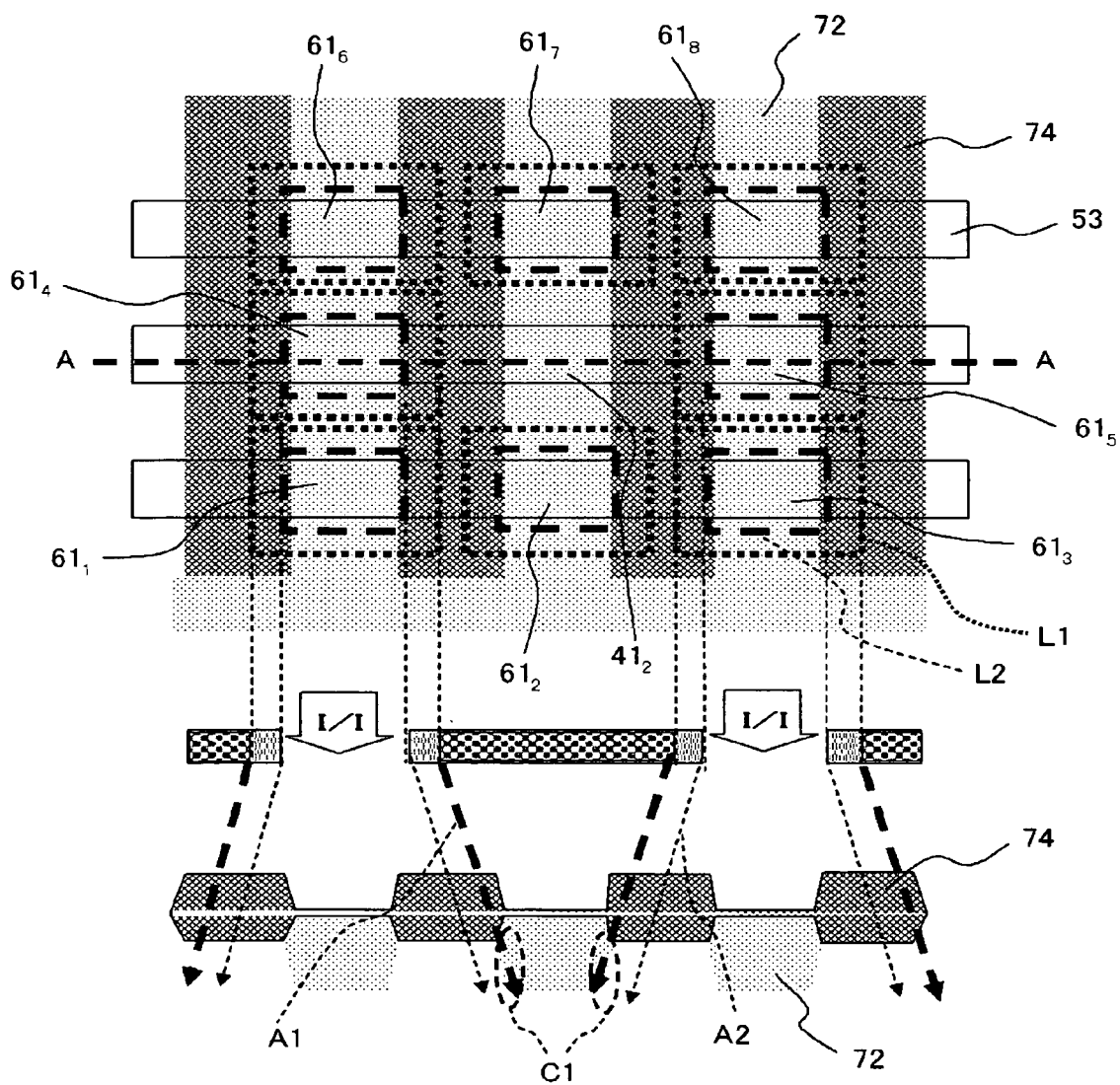
FIG. 7 includes a schematic plan view and cross-sectional view for explaining the method of manufacturing according to the embodiment.

To be more detailed, openings of the mask corresponding to the dummy cell $61_1$ to $61_8$ (indicated by broken lines L1 in FIG. 7) are made larger in area than openings corresponding to those memory cells to be set in an ON state (indicated by broken lines L2 as a reference), among the memory cells, as shown in FIG. 7. In FIG. 7, the upper portion is a plan view of the reference cell array, and the lower portion is a cross-sectional view taken along the line A-A in the plan view. As is apparent from FIG. 7, the word line $53$ extends in a direction perpendicular to a direction along which diffusion layers $72$ and isolation regions $74$ are aligned.

Making the openings corresponding to the dummy cells $61_1$ to $61_8$ in a larger size as above allows the impurity implanted through the openings for the dummy cells $61_1$ to $61_8$ to reach the diffusion layer of the reference cell $41_2$ as indicated by the arrow A1. Accordingly, the impurity exudes in a region enclosed by the broken lines C1. As a result of such exudation, the reference cell $41_2$ obtains a first region located between two isolation regions $74$ and having a first impurity concentration, and a second region (where the impurity has exuded) located between the first region and at least one of the isolation regions $74$ and having a second impurity concentration higher than the first impurity concentration. Here, the impurity concentration of the dummy cells $61_4$, $61_5$ on the respective sides of the reference cell $41_2$ is equal to or higher than the second impurity concentration. Also, in the semiconductor storage device $1$, the memory cell $11_1$ gains a first off-leak characteristic, and the reference cell $41_2$ gains a second off-leak characteristic larger than the first off-leak characteristic.

Unlike the above, when the openings for the dummy cells $61_1$ to $61_8$ are made in the same size as those for the memory cells, the impurity implanted through the openings for the dummy cells $61_1$ to $61_8$ does not reach the diffusion layer of the reference cell $41_2$ as indicated by the arrow A2, and is hence kept from exuding.

Figure 8:
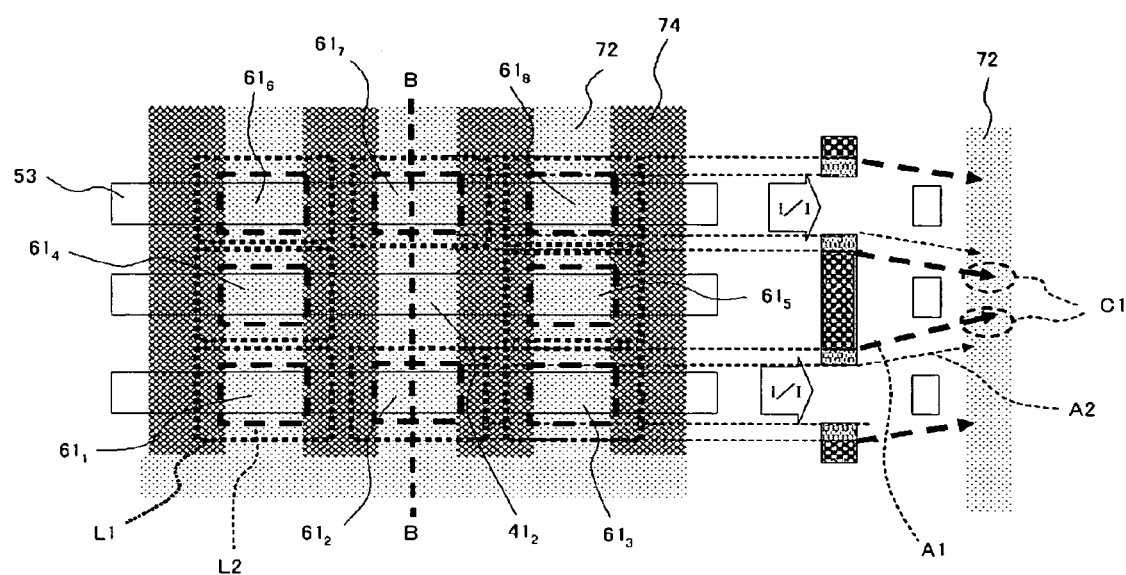
FIG. 8 includes a schematic plan view and cross-sectional view for explaining the method of manufacturing according to the embodiment.
Figure 9:
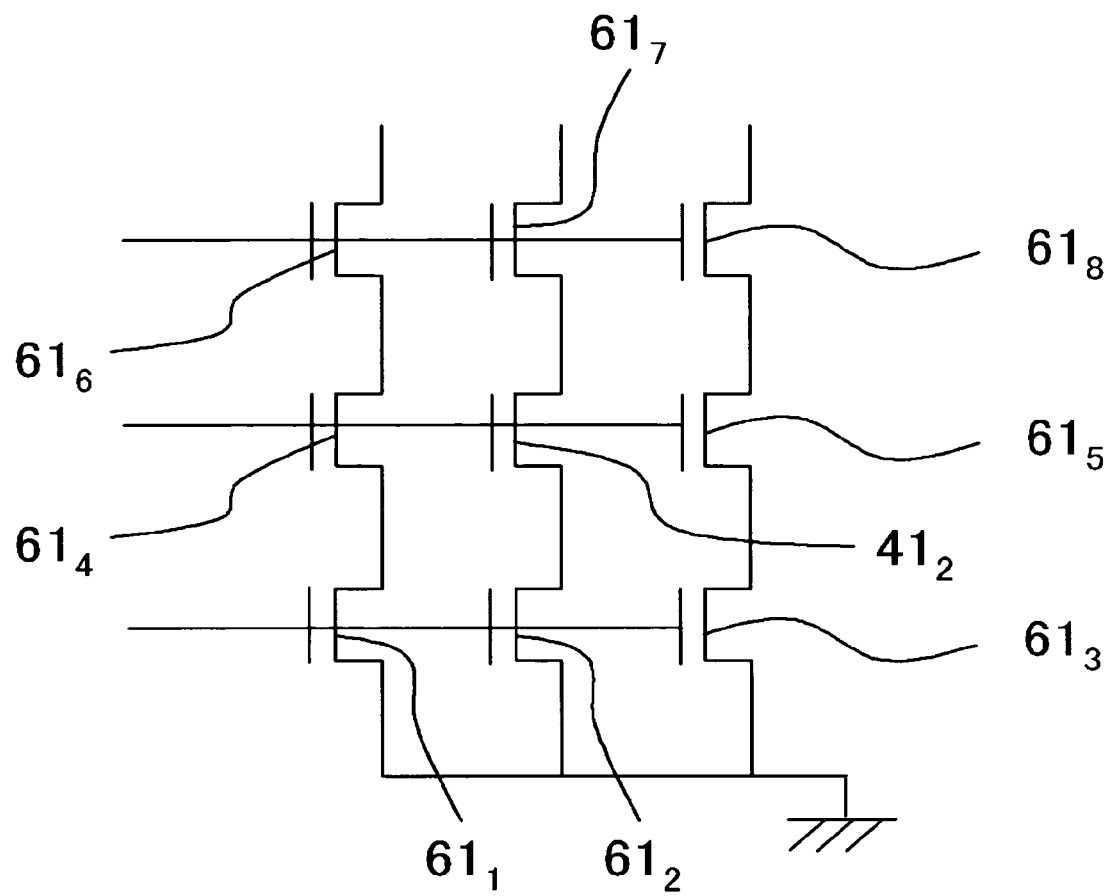
FIG. 9 is a circuit diagram corresponding to a reference cell array shown in FIGS. 7 and 8.

In addition, in the direction along which the diffusion layers $72$ and the isolation regions $74$ are aligned, the impurity exudes out of the dummy cells $61_1$ to $61_8$ to the reference cell $41_2$, as shown in FIG. 8. In FIG. 8, the left portion is a plan view of the reference cell array, and the right portion is a cross-sectional view taken along the line B-B in the plan view. Here, the circuit diagram corresponding to the reference cell array shown in FIGS. 7 and 8 is as shown in FIG. 9.

The foregoing embodiment offers the following advantageous effects. In this embodiment, the impurity is implanted into the dummy cells $61_1$ to $61_8$ so that the impurity exudes out of the dummy cell $61_1$ to $61_8$ to the reference cell $41_2$. This provokes leak from the reference cell $41_2$, under a high temperature. The leak lowers the voltage level of the reference cell $41_2$, thereby preventing the voltage of the memory cell and that of the reference cell from being reversed, even when the memory cell incurs leak.

Figure 3:
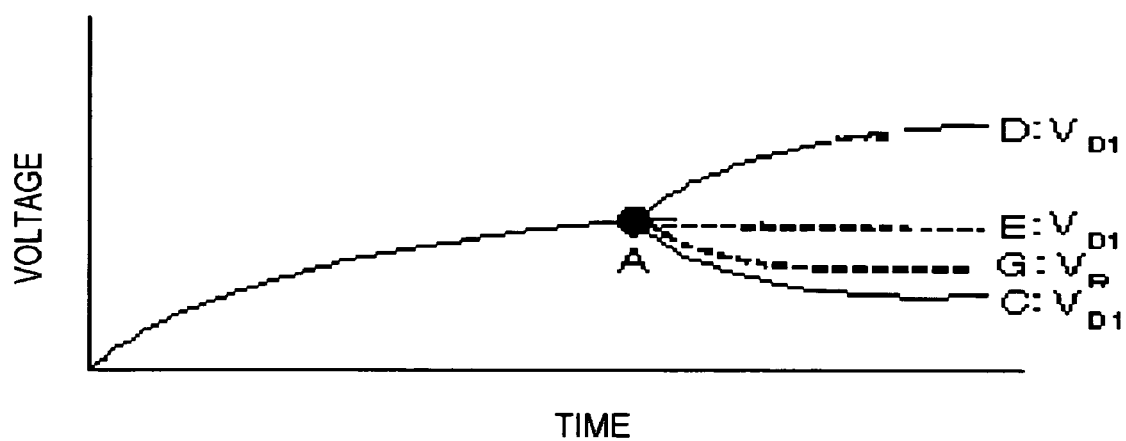
FIG. 3 is a graph for explaining an advantageous effect of a method of manufacturing according to an embodiment.
Figure 4:
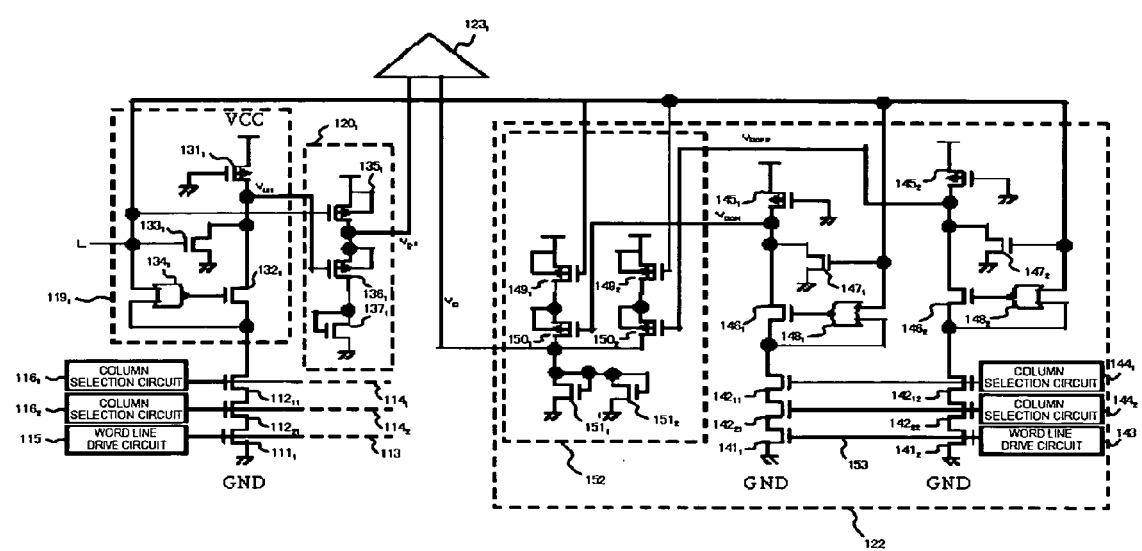
FIG. 4 is a circuit diagram of a conventional semiconductor storage device.
Figure 5:
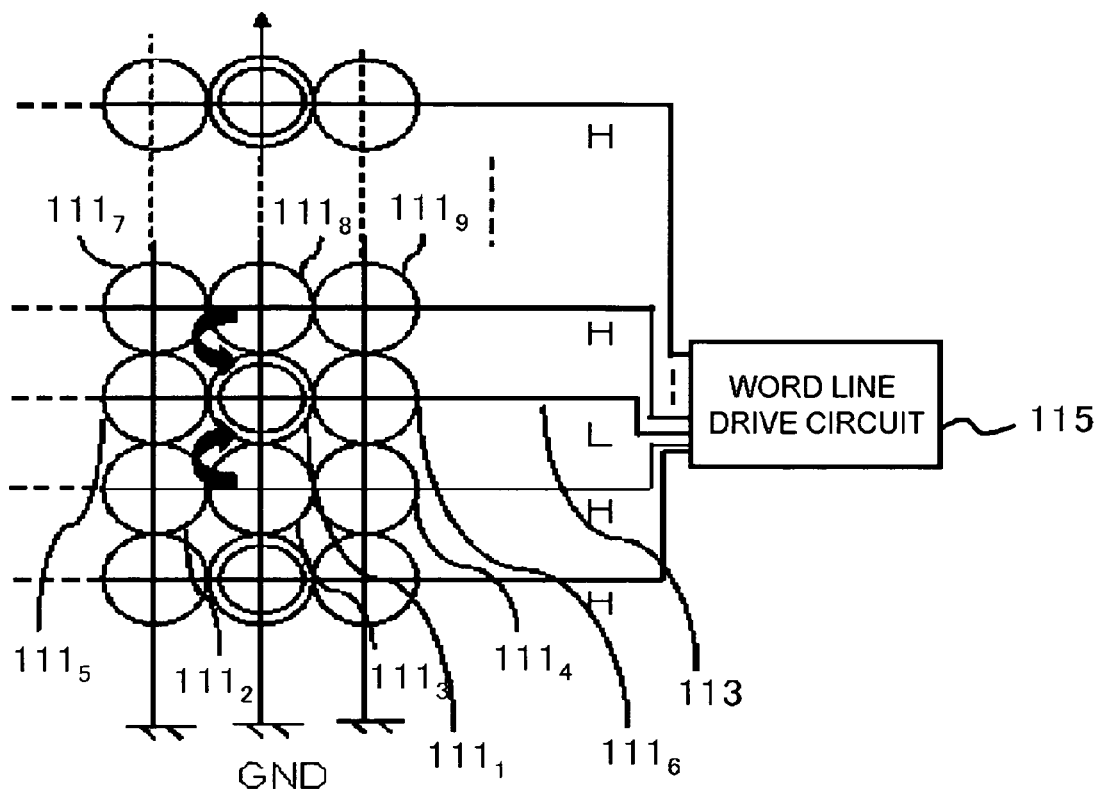
FIG. 5 is a schematic diagram showing a detailed configuration of a word line drive circuit, memory cells and a word line in the semiconductor storage device of FIG. 4.
Figure 6:
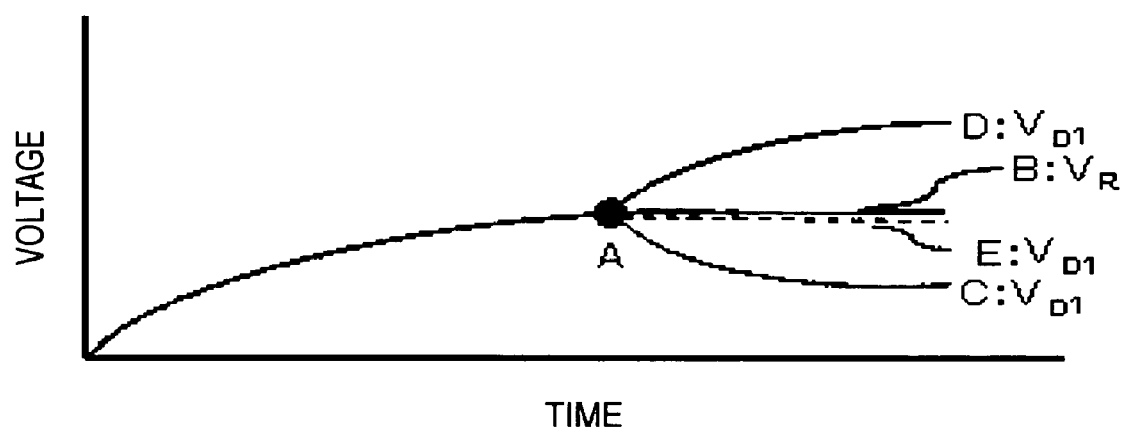
FIG. 6 is a graph for explaining a drawback of the conventional semiconductor storage device.

Such aspect will be further described referring to FIG. 3. With the start of the data read-out, the voltage $V_{D1}$ and the voltage $V_R$ respectively applied to the first and the second input terminal of the sense amp $23_1$ increase through a generally similar process, until the selection cells $12_{11}$, $12_{21}$, the selection cells $42_{11}$, $42_{21}$ and the selection cells $42_{12}$, $42_{22}$ are turned ON. Then, also through a period until a H-level signal is applied to a location other than the word line $13$, the voltage $V_{D1}$ and the voltage $V_R$ increase through a similar process (point A in FIG. 3).

When the H-level signal is applied to a location other than the word line 53, the voltage $V_R$ incurs a drop in potential at a node F (FIG. 2) because of the leak from the reference cell $41_2$, and resultantly moves as indicated by the line G in FIG. 3. The voltage $V_{Dn}$, in contrast, descends as the line C in FIG. 3 when the memory cell $11_1$ is an ON cell. When the memory cell $11_1$ is an OFF cell and does not incur cell leak, the voltage $V_{Dn}$ keeps increasing further as the line D in FIG. 3, however when the memory cell $11_1$ is an OFF cell and incurs cell leak, the voltage $V_{Dn}$ moves as shown by the line E in FIG. 3. Accordingly, even when the memory cell is an OFF cell and incurs cell leak, the level of the voltage $V_{Dn}$ and the $V_R$ is not reversed, and hence a correct decision is output. In addition, when the temperature is not high the leak current does not emerge, and hence neither the voltage $V_{Dn}$ nor $V_R$ is decreased, which assures stable performance of the storage device.

Also, as already stated, the second input terminal of the sense amp $23_1$ receives the voltage $V_R$, which is the median value between the voltage $V_{RON}$ according to the ON state of the reference cell $41_1$ and the voltage $V_{ROFF}$ according to the OFF state of the reference cell $41_2$, and therefore the voltage $V_R$ is automatically set at the median value between the voltage $V_{DON}$ based on an ON state of the memory cell $11_1$ and the voltage $V_{DOFF}$ based on an OFF state of the memory cell $11_1$ constantly. As a result, a sufficient margin for detecting both of the ON state and the OFF state of the memory cell $11_1$ can be secured.

The semiconductor storage device and the method of manufacturing the same according to the present invention are not limited to the foregoing embodiment, but various modifications may be made. To cite a few examples, the method of manufacturing according to the embodiment may include forming the word line connected to the reference cell $41_2$ set in an OFF state in a finer size than the word line connected to the memory cell $11_1$. Such configuration makes the effective L size between the drain and the source of the selection reference cell $41_2$ finer, thereby allowing the impurity to exude upon performing the ion implantation. This assures emergence of the cell leak under a high temperature.

Also, when performing the impurity implantation, the impurity may be implanted at a higher dosage into the dummy cells $61_1$ to $61_8$ than into a memory cell set in an ON state among the memory cells. Such arrangement also allows the impurity to exude out of the dummy cells $61_1$ to $61_8$ to the selection reference cell $41_2$, thereby assuring emergence of the cell leak under a high temperature.

It is apparent that the present invention is not limited to the above embodiment, and may be modified and changed without departing from the scope and spirit of the invention.

What is claimed is:

1. A semiconductor storage device that reads out information stored in a memory cell through comparison with information of a reference cell serving as a standard,
    wherein said memory cell has a first off-leak characteristic,
    said reference cell has a second off-leak characteristic larger than said first off-leak characteristic, and
    said reference cell includes a first region having a first impurity concentration located between two isolation regions and a second region having a second impurity concentration located between and in contact with at least one of said two isolation regions and said first region,
    wherein said second region has a second impurity concentration higher than said first impurity concentration.

2. The semiconductor storage device according to claim 1 further having a dummy cell located on the respective sides of said reference cell;
    wherein an impurity concentration of said dummy cell is equal to or higher than said second impurity concentration.

3. A semiconductor storage device that reads out information stored in a memory cell, the semiconductor storage device comprising:
    a reference cell; and
    a plurality of dummy cells surrounding said reference cell,
    wherein said reference cell comprises:
        a first region having a first impurity concentration located between two isolation regions; and
        at least one second region having a second impurity concentration, said at least one second region located between at least one of said two isolation regions and said first region, and adjoining at least one of said two isolation regions and said first region,
    wherein said second impurity concentration in said at least one second region controls a leakage characteristic of said reference cell, and
    wherein said second region has a second impurity concentration higher than said first impurity concentration.

* * * * *